United States Patent
Yan et al.

(10) Patent No.: US 12,414,403 B2
(45) Date of Patent: Sep. 9, 2025

(54) MODIFIED TUNNEL OXIDE LAYER AND PREPARATION METHOD, TOPCON STRUCTURE AND PREPARATION METHOD, AND SOLAR CELL

(71) Applicant: Teranergy Technology Co., Ltd., Ningbo (CN)

(72) Inventors: Baojie Yan, Ningbo (CN); Yuheng Zeng, Ningbo (CN); Haiyang Xing, Ningbo (CN); Jichun Ye, Ningbo (CN); Wei Liu, Ningbo (CN); Mingdun Liao, Ningbo (CN); Dian Ma, Ningbo (CN); Na Lin, Ningbo (CN); Zetao Ding, Ningbo (CN)

(73) Assignee: TERANERGY TECHNOLOGY CO., LTD., Ningbo (CN)

( * ) Notice: Subject to any disclaimer, the term of this patent is extended or adjusted under 35 U.S.C. 154(b) by 0 days.

(21) Appl. No.: 19/011,690

(22) Filed: Jan. 7, 2025

(65) Prior Publication Data
US 2025/0143004 A1    May 1, 2025

Related U.S. Application Data

(63) Continuation of application No. PCT/CN2022/129404, filed on Nov. 3, 2022.

(30) Foreign Application Priority Data

Jul. 7, 2022    (CN) .......................... 202210803527.2

(51) Int. Cl.
H10F 71/00    (2025.01)
H10F 71/10    (2025.01)
(Continued)

(52) U.S. Cl.
CPC ......... *H10F 71/129* (2025.01); *H10F 71/103* (2025.01); *H10F 71/128* (2025.01); *H10F 77/1662* (2025.01); *H10F 77/311* (2025.01)

(58) Field of Classification Search
None
See application file for complete search history.

(56) References Cited

U.S. PATENT DOCUMENTS

2016/0284923 A1*    9/2016    Johnson ................ H10F 10/146

FOREIGN PATENT DOCUMENTS

| CN | 104505419 A | 4/2015 |
| CN | 105513960 A | 4/2016 |

(Continued)

OTHER PUBLICATIONS

English language machine translation of CN 112420881 A. (Year: 2025).*

(Continued)

*Primary Examiner* — Eli S Mekhlin
(74) *Attorney, Agent, or Firm* — Bayramoglu Law Offices LLC

(57) ABSTRACT

A modified tunnel oxide layer and a preparation method, a TOPCon structure and a preparation method, and a solar cell are provided. The modified tunnel oxide layer is $SiO_x$ subjected to plasma surface treatment, and a $Si^{4+}$ content in the $SiO_x$ is greater than or equal to above 18%. The density of the interface state subjected to plasma surface treatment decreases, and compared with the silicon oxide layer prepared in the prior arts, boron has a low diffusion rate in the modified silicon oxide layer and hence the damaging effect of the boron on the tunnel oxide layer is reduced effectively, thereby improving the integrity of the silicon oxide layer and maintaining chemical passivation effect. The modified tun- (Continued)

nel oxide layer significantly increases the performance indexes of the TOPCon structure.

16 Claims, 1 Drawing Sheet

(51) Int. Cl.
  *H10F 77/166* (2025.01)
  *H10F 77/30* (2025.01)

(56) References Cited

FOREIGN PATENT DOCUMENTS

| | | |
|---|---|---|
| CN | 112271235 A | 1/2021 |
| CN | 112420881 A | 2/2021 |
| CN | 115274404 A | 11/2022 |

OTHER PUBLICATIONS

Lee et al., ACS Sustainable Chem. Eng. 2019, 7, 19332-19337. (Year: 2019).*

* cited by examiner

MODIFIED TUNNEL OXIDE LAYER AND PREPARATION METHOD, TOPCON STRUCTURE AND PREPARATION METHOD, AND SOLAR CELL

CROSS REFERENCE TO THE RELATED APPLICATIONS

This application is the continuation application of International Application No. PCT/CN2022/129404, filed on Nov. 3, 2022, which is based upon and claims priority to Chinese Patent Application No. 202210803527.2, filed on Jul. 7, 2022, the entire contents of which are incorporated herein by reference.

TECHNICAL FIELD

The present disclosure relates to the field of solar cell technologies and in particular to a modified tunnel oxide layer and a preparation method, a TOPCon structure and a preparation method, and a solar cell.

BACKGROUND

The tunnel oxide passivated contact structure (TOPCon) is a new crystalline silicon solar cell structure proposed by German Fraunhofer Research Institute. The core of such structures is to passivating silicon wafer surface by a laminated structure of ultrathin silicon oxide layer and doped polycrystalline silicon. The passivation mechanism of the tunnel silicon oxide passivated contact structure mainly includes the following two aspects: the first is the chemical passivation effect of interface silicon oxide layer and the second is the field passivation effect of the doping atoms. In this way, the integrity of the interface silicon oxide can be improved, which is favorable for increasing the chemical passivation effect of the surface.

The preparation of the TOPCon cell is carried out as below: cleaning and texturing—diffusing boron emitter—etching—back surface preparation of $SiO_2$—PECVD heavily-doped polycrystalline silicon—high-temperature annealing—front surface aluminum oxide and $Si_3N_4$—screen printing. For the tunnel silicon oxide passivated contact technology, the electron collection is carried out by an n-type phosphor-doped polycrystalline silicon film, and the hole collection is carried out by a p-type boron-doped polycrystalline film. Due to good effect of the n-type passivated contact technology, it has been widely accepted as next generation of industrial efficient crystalline silicon cell technology.

In the prior arts, polycrystalline silicon is grown by low-pressure chemical vapor deposition (LPCVD), but the LPCVD has the following problems: low rate of in-situ doping and film formation, need for secondary doping and tedious process; presence of wrap-around and long etching time; regular maintenance of equipment and high cost. The above problems can be solved by plasma enhanced chemical vapor deposition (PECVD). At present, the n-type TOPCon cell prepared well has an efficiency of up to 25.5% but the n-type TOPCon cell uses a high-cost n-type silicon wafer. Further, silver paste is used on the back surface of the n-type TOPCon cell, which also increases the costs. In comparison, the p-type TOPCon cell uses a low-cost p-type silicon wafer and a low-cost silver paste can be used on its back surface, significantly decreasing the cell cost and hence improving the product competiveness. However, the development of the p-type TOPCon cell has to face the following problem: the passivation quality of the p-type TOPCon structure is bad, failing to satisfy the requirements. Therefore, development of the technology for a high-performance p-type TOPCon is favorable for increasing the industrial technological reserve and promoting the industrial technological development. In addition, the p-type TOPCon technology can also be used in the new efficient cell technologies of TBC cells and laminated cells and the like. Therefore, it is extremely urgent to develop and improve the p-type TOPCon technology.

The PECVD technology is a technology suitable for preparing a boron-doped polycrystalline silicon. But the existing silicon oxide preparation technology still has many problems and cannot produce a high-performance p-type TOPCon structure in cooperation with the PECVD. The existing preparation methods of the silicon oxide film include plasma-assisted $N_2O$ oxidation method, nitric acid oxidation method and thermal oxygen oxidation method. In use of the plasma-assisted $N_2O$ oxidation method, the oxygen plasma bombardment can introduce a huge number of defects at the interface, leading to bad passivation effect. In use of the nitric acid oxidation method, because the silicon oxide surface is relatively loose, the silicon oxide can be damaged during a cleaning and transfer process. In use of the thermal oxygen oxidation method, the silicon oxide has good quality but is relatively thick, leading to bad contact. Finally, based on the silicon oxide prepared by the above three methods, the optimal passivation effect of the p-TOPCon can only reach 700 mV-705 mV, and the corresponding single-side saturation current density ($J_0$) is usually above 15 $fA/cm^2$, and in the subsequent printing electrode sintering process, the $iV_{oc}$ may further decrease, leading to lower device performance.

SUMMARY

For the shortcomings of the prior arts, the technical problem to be solved by the present disclosure is how to improve the passivation quality of the TOPCon structure in order to prepare an efficient solar cell.

In order to solve the above problems, a first aspect of the present disclosure provides a modified tunnel oxide layer which is $SiO_x$ subjected to plasma surface treatment, where a $Si^{4+}$ content in the $SiO_x$ is greater than or equal to above 18%.

Furthermore, the modified tunnel oxide layer has a thickness of 1 to 4 nm.

A second aspect of the present disclosure provides a preparation method of the above modified tunnel oxide layer, which includes the following steps:
  at step S1, by ion-free bombardment oxidation method, forming a $SiO_x$ layer on a surface of a semiconductor substrate;
  at step S2, with hydrogen and an oxygen-containing gas as treatment atmosphere, performing treatment on $SiO_x$ surface by plasma to obtain a modified tunnel oxide layer.

Furthermore, the ion-free bombardment oxidation method in the step S1 is selected from any one of the followings: oxidizing gas oxidation method, low-temperature oxidation method and chemical reagent oxidation method.

Furthermore, the step S2 is carried out in a PECVD apparatus.

Furthermore, the plasma treatment method in the step S2 is a continuous plasma treatment or pulsed plasma treatment.

Furthermore, the oxygen-containing gas is selected from any one of the followings: $N_2O$, $CO_2$ and $O_2$.

A third aspect of the present disclosure provides a TOPCon structure, which includes the above modified tunnel oxide layer.

A fourth aspect of the present disclosure provides a preparation method of the TOPCon structure, which includes the following steps: cleaning of a semiconductor substrate; preparation of a modified tunnel oxide layer; preparation of a doped amorphous silicon layer; annealing; where the preparation of the modified tunnel oxide layer is carried out by the above preparation method.

A fifth aspect of the present disclosure provides a solar cell, which includes the above TOPCon structure.

Compared with the prior arts, the present disclosure has the following beneficial effects.

The $Si^{4+}$ content in the $SiO_x$ in the modified tunnel oxide layer of the present disclosure reaches above 18%. The density of the interface state subjected to plasma surface treatment decreases, and compared with the silicon oxide layer prepared in the prior arts, boron has a low diffusion rate in the modified silicon oxide layer and hence the damaging effect of the boron on the tunnel oxide layer is reduced effectively, thereby improving the integrity of the silicon oxide layer and maintaining chemical passivation effect.

In the present disclosure, the tunnel oxide is prepared in two steps: in the first step, one layer of silicon oxide without bombardment damage is prepared. In this method, the ion bombardment damage in the subsequent second step can be significantly reduced, and thus the passivation quality can be obviously improved. By the method, the defects of the interface state are reduced effectively, and the interface state obtained by the conventional plasma $N_2O$ oxidation method is usually $1\times10^{12}$ $eV^{-1}*cm^{-2}$. When the new preparation method is used, the density of the defect state can be lowered to $0.5\times10^{12}$ $eV^{-1}*cm^{-2}$.

In the present disclosure, surface modification treatment is performed on $SiO_x$ layer by hydrogen and an oxygen-containing gas, and hydrogen plasma has a heating effect on the surface, increasing the energy of the atoms such as oxygen and nitrogen and enhancing the bonding quality. Hydrogen plasma can etch weak bonds of the $SiO_x$ surface to enable the valence bond in the silicon oxide to be more stable. These two effects enable $SiO_x$ to retain more stable Si—O, thereby increasing the performance.

The oxygen-containing gas is preferably $N_2O$. The $H_2$ has reducibility to activate the silicon oxide surface and allow N atoms in $N_2O$ to bond with silicon oxide, thereby significantly decreasing the concentration of the boron on the silicon surface and lowering the boron defects. The N atoms also have a capturing effect on the H atoms, which can effectively reduce Hydrogen (H) spillover in a sintering process, enabling $iV_{oc}$ to remain at a high level in the subsequent sintering process.

The preparation method is compatible with the current mass-production equipment technology and especially with the mass-production PECVD equipment. The gas material used herein is low in cost, almost not increasing additional material costs.

The present disclosure provides a preparation method of a high-performance modified silicon oxide with high nitrogen concentration and low ion bombardment damage to replace the conventional silicon oxide layer and significantly increase the performance indexes of the TOPCon structure. iVoc in the passivation index of the P-type TOPCon reaches 730 mV with the contact resistivity lowering to 5 $m\Omega cm^2$.

The TOPCon structure has the modified tunnel oxide layer and can still have a high level of passivation in the subsequent sintering process, which is favorable for preparation of efficient solar cells.

BRIEF DESCRIPTIONS OF THE DRAWINGS

DETAILED DESCRIPTIONS OF THE EMBODIMENTS

Figure 1:
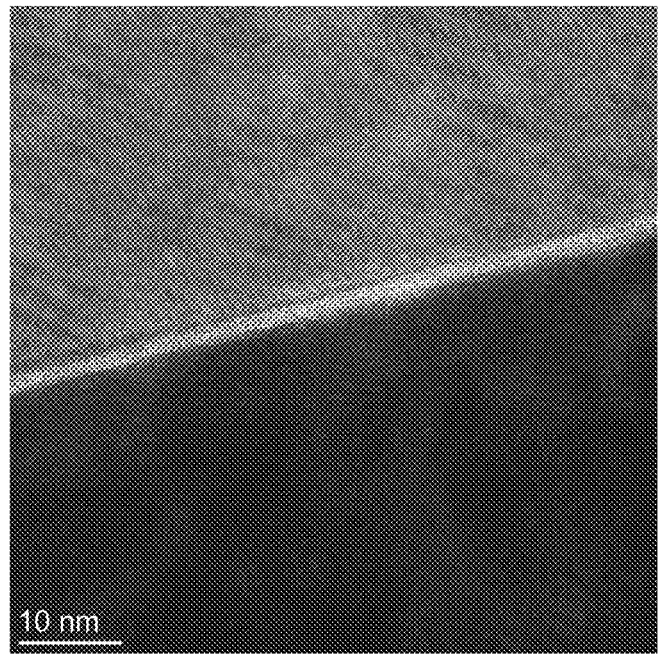
FIG. 1 is a micro-structural diagram illustrating a modified tunnel oxide layer according to an embodiment 1 of the present disclosure.

In order to make the above objects, features and advantages of the present disclosure clearer and more intelligible, the specific embodiments of the present disclosure will be detailed below with the drawings. It should be noted that the following embodiments are used only to illustrate the implementation methods and typical parameters of the present disclosure rather than to limit the parameter range of the present disclosure. Therefore, any reasonable changes derived herefrom shall be within the scope of protection of the claims of the present disclosure.

It should be noted that the endpoints of the ranges and any values disclosed herein are not limited to such precise ranges or values. These ranges and values shall be understood as including values approaching these ranges or values. For any numerical ranges, combination may be performed between the endpoint values of each range, between the endpoint value of each range and an individual point value and between the individual endpoint values to produce one or more new numerical ranges. These numerical ranges shall be considered as disclosed herein.

As mentioned in the background, the current preparation methods for the tunnel oxide layer in the TOPCon include nitric acid oxidation method, $N_2O$ plasma oxidation method, thermal oxidation method and ozone oxidation method. In these methods, reagents or gases or the like with strong oxidizing property are used to oxidize silicon wafer surface to form an ultrathin layer of $SiO_2$ as tunnel oxide layer. But, after these oxide layers grow P-Poly, there may be excessively large contact resistivity or many defect states due to excessively compact oxide layer, leading to poor passivation effect.

In view of the above, a specific embodiment of the present disclosure provides a preparation method of a TOPCon structure, which includes the following steps: cleaning of a semiconductor substrate, preparation of a modified tunnel oxide layer, preparation of a doped amorphous silicon layer, and annealing.

The preparation method of the modified tunnel oxide layer includes the following steps: at step S1, by ion-free bombardment oxidation method, a SiOx layer is formed on a surface of the semiconductor substrate; at step S2, with hydrogen and oxygen-containing gas as treatment atmosphere, SiOx surface is treated with plasma to obtain a modified tunnel oxide layer.

The ion-free bombardment oxidation method in the step S1 may be an oxidizing gas oxidation method, a low-temperature oxidation method (100 to 600° C.) or a chemical reagent oxidation method, and the typical method is an ozone oxidation method, a nitric acid oxidation method or the like. In this step, one silicon oxide layer without bombardment damage is prepared. By this method, the ion bombardment damage in the subsequent second step can be significantly reduced, thereby obviously increasing the passivation quality.

The plasma treatment method in the step S2 is a continuous plasma treatment or pulsed plasma treatment. This step is carried out in a PECVD apparatus. In a specific embodiment, a plasma treatment power is 5 to 10 w, with a treatment time of 50 to 150 S. A flow ratio of the hydrogen and the oxygen-containing gas is 2:1 to 8:1. In this method, surface modification treatment is performed on $SiO_x$ layer by the hydrogen and the oxygen-containing gas, and hydrogen plasma has a heating effect on the surface, increasing the energy of the atoms such as oxygen and nitrogen and enhancing the bonding quality. Hydrogen plasma can etch weak bonds of the $SiO_x$ surface to enable the valence bond in the silicon oxide to be more stable. These two effects enable $SiO_x$ to retain more stable Si—Os, thereby increasing the performance.

The oxygen-containing gas is $N_2O$ or $CO_2$, and preferably, $N_2O$. The combination of N atoms and silicon oxide can significantly lower the concentration of the boron on the silicon surface, thereby reducing the boron defects. The N atoms also have a capturing effect on the H atoms, which can effectively reduce H spillover in a sintering process, enabling iVoc to remain at a high level in the subsequent sintering process.

The modified tunnel oxide layer prepared in the above method has a thickness of 1 to 4 nm, the $Si^{4+}$ content in $SiO_x$ reaches over 18%, and the density of the interface state is lower than $0.5 \times 10^{12}$ $eV^{-1}$ $cm^{-2}$. Compared with the silicon oxide layer prepared in the prior arts, the boron has a low diffusion rate in the modified silicon oxide layer, effectively reducing the damaging effect of the boron on the tunnel oxide layer, improving the integrity of the silicon oxide layer and maintaining the chemical passivation effect.

The above modified tunnel oxide layer may be applied to a P-type TOPCon cell or N-type TOPCon cell and can significantly increase the performance indexes of the TOPCon structure. iVoc in the passivation index of the P-type TOPCon can reach above 730 mV, and the corresponding single-side saturation current density ($J_0$) is lowered to below 7 $fA/cm^2$, and the contact resistance is lowered to 5 $m\Omega cm^2$.

The present disclosure will be detailed below with specific embodiments. In the following embodiments and control embodiments, the semiconductor substrate is an n-type monocrystalline silicon wafer with a thickness of 160 μm, with two sides chemically polished and the resistivity being 0.8 Ω·cm.

Embodiment 1

A double-sided p-type tunnel silicon oxide passivated structure is provided, and its preparation method includes the following steps.
1) A silicon wafer was cut into a size of 4 cm×4 cm and subjected to standard RCA cleaning.
2) The silicon wafer was placed in an ozone generator to grow a $SiO_2$ film.
3) The sample was placed into a PECVD apparatus and continuous plasma treatment was performed with $N_2O$ and $H_2$ as treatment atmosphere and the flow ratio of 4:1 for a time of 100 S under the power of 5 W.
4) Next, a boron-doped amorphous silicon film was deposited on both sides of the silicon wafer by using the PECVD apparatus.
5) The sample was placed into a tubular annealing furnace for annealing under an annealing temperature of 800 to 920° C. for a time of 30 minutes.

Observation is made to the modified tunnel oxide layer of the p-type tunnel silicon oxide passivated structure. As shown in FIG. 1, the modified tunnel oxide layer has a thickness of 1.7 nm.

Embodiment 2

A double-sided p-type tunnel silicon oxide passivated structure is provided, and its preparation method includes the following steps.
1) A silicon wafer was subjected to standard RCA cleaning.
2) The silicon wafer was placed into an ozone generator to grow a $SiO_2$ film.
3) The sample was placed into a PECVD apparatus and continuous plasma treatment was performed with $N_2O$ and $H_2$ as treatment atmosphere and the flow ratio of 2:1 for a time of 100 S under the power of 5 W.
4) Next, a boron-doped amorphous silicon film was deposited on both sides of the silicon wafer by using the PECVD apparatus.
5) The sample was placed into a tubular annealing furnace for annealing under an annealing temperature of 800 to 920° C. for a time of 30 minutes.

Figure 2:
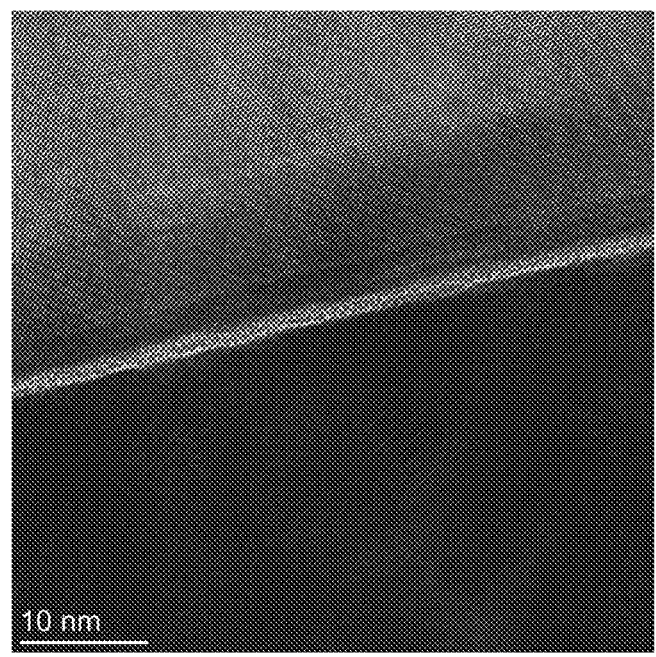
FIG. 2 is a micro-structural diagram illustrating a modified tunnel oxide layer according to an embodiment 2 of the present disclosure.

Observation is made to the modified tunnel oxide layer of the p-type tunnel silicon oxide passivated structure. As shown in FIG. 2, the modified tunnel oxide layer has a thickness of 1.6 nm.

Embodiment 3

A double-sided p-type tunnel silicon oxide passivated structure is provided, and its preparation method includes the following steps.
1) A silicon wafer was subjected to standard RCA cleaning.
2) The silicon wafer was placed into an ozone generator to grow a $SiO_2$ film of about 1.5 nm.
3) The sample was placed into a PECVD apparatus and continuous plasma treatment was performed with $N_2O$ and $H_2$ as treatment atmosphere and the flow ratio of 8:1 for a time of 100 S under the power of 5 W.
4) Next, a boron-doped amorphous silicon film was deposited on both sides of the silicon wafer by using the PECVD apparatus.
5) The sample was placed into a tubular annealing furnace for annealing under an annealing temperature of 800 to 920° C. for a time of 30 minutes.

Embodiment 4

A double-sided p-type tunnel silicon oxide passivated structure is provided, and its preparation method includes the following steps.
1) A silicon wafer was subjected to standard RCA cleaning.
2) The silicon wafer was placed into an annealing furnace to receive low-temperature oxidation treatment under the oxidation temperatures of 200° C., 300° C. and 400° C. and grow a $SiO_2$ film of about 1.5 nm.
3) The sample was placed into a PECVD apparatus and continuous plasma treatment was performed with $N_2O$ and $H_2$ as treatment atmosphere and the flow ratio of 2:1 for a time of 100 S under the power of 5 W.

4) Next, a boron-doped amorphous silicon film was deposited on both sides of the silicon wafer by using the PECVD apparatus.
5) The sample was placed into a tubular annealing furnace for annealing under an annealing temperature of 800 to 920° C. for a time of 30 minutes.

Embodiment 5

A double-sided p-type tunnel silicon oxide passivated structure is provided, and its preparation method includes the following steps.
1) A silicon wafer was subjected to standard RCA cleaning.
2) The silicon wafer was placed into nitric acid to grow a $SiO_2$ film of about 1.5 nm.
3) The sample was placed into a PECVD apparatus and pulsed plasma treatment was performed with $N_2O$ and $H_2$ as treatment atmosphere and the flow ratio of 2:1 for a time of 10 sec under the power of 6 W. Then, the plasma was shut off and nitrogen gas was introduced to blow for 10 s. The above was one cycle. Then ten cycles were repeated continuously.
4) Next, a boron-doped amorphous silicon film was deposited on both sides of the silicon wafer by using the PECVD apparatus.
5) The sample was placed into a tubular annealing furnace for annealing under an annealing temperature of 800 to 920° C. for a time of 30 minutes.

Control Embodiment 1

A double-sided p-type tunnel silicon oxide passivated structure is provided, and its preparation method includes the following steps.
1) A silicon wafer was cut into a size of 4 cm×4 cm and subjected to standard RCA cleaning.
2) The silicon wafer was placed into nitric acid to form a surface oxide layer.
3) After the silicon wafer was cleaned and blown dry, a boron-doped amorphous silicon film was deposited on both sides of the silicon wafer by using the PECVD apparatus.
4) The sample was placed into a tubular annealing furnace for annealing under an annealing temperature of 800 to 920° C. for a time of 30 minutes.

Control Embodiment 2

A double-sided p-type tunnel silicon oxide passivated structure is provided, and its preparation method includes the following steps.
1) A silicon wafer was cut into a size of 4 cm×4 cm and subjected to standard RCA cleaning.
2) The silicon wafer was placed into a PECVD apparatus, and plasma treatment was performed on both sides with $N_2O$ as treatment atmosphere for a time of 100 S under the power of 10 W.
3) Next, a boron-doped amorphous silicon film was deposited on both sides of the silicon wafer by using the PECVD apparatus.
4) The sample was placed into a tubular annealing furnace for annealing under an annealing temperature of 800 to 920° C. for a time of 30 minutes.

The passivation performance and contact performance of the embodiments 1 to 5 are analyzed and tested, and the passivation performance of the control embodiments 1 and 2 is analyzed and tested. The test results are shown in Table 1 for comparison.

TABLE 1 passivation performances of the samples in the embodiments and control embodiments

| Annealing temperature | Passivation effect | Embodiment 1 | Embodiment 2 | Embodiment 3 | Embodiment 4 | Embodiment 5 | Control embodiment 1 | Control embodiment 2 |
|---|---|---|---|---|---|---|---|---|
| 800° C. | iVoc (mV) | 717 | 718 | 710 | 730 | 733 | 705 | 662 |
|  | Contact resistivity (m$\Omega$cm$^2$) | 12 | 12 | 10 | 18 | 16 | 14 | 15 |
| 860° C. | iVoc (mV) | 731 | 726 | 713 | 733 | 735 | 696 | 703 |
|  | Contact resistivity (m$\Omega$cm$^2$) | 5 | 4 | 7 | 6 | 3 | 4 | 3 |
| 920° C. | iVoc (mV) | 720 | 719 | 708 | 736 | 738 | 653 | 696 |
|  | Contact resistivity (m$\Omega \cdot$ cm$^2$) | 1 | 0.8 | 1.5 | 1.5 | 2 | 0.8 | 0.7 |

From the data comparison, it can be known that the p-type tunnel silicon oxide passivated structure in the embodiments 1 to 5 have the modified tunnel oxide layer and has much better passivation performance than in the control embodiments 1 and 2. The back junction cells prepared by the process in the embodiment 1 have an efficiency of up to 23.17%.

Although the descriptions are made as above, the present disclosure is not limited hereto. Any persons skilled in the arts can make various modifications and variations without departing from the spirit and scope of the present disclosure. Therefore, the scope of protection of the present disclosure shall be defined by the appended claims.

What is claimed is:
1. A preparation method of a modified tunnel oxide layer, comprising:
step S1: by an ion-free bombardment oxidation method, forming a $SiO_x$ layer on a surface of a semiconductor substrate to obtain a $SiO_x$ surface; and
step S2: with hydrogen and an oxygen-containing gas as a treatment atmosphere, performing treatment on the $SiO_x$ surface by plasma to obtain the modified tunnel oxide layer.

2. The preparation method of claim 1, wherein the ion-free bombardment oxidation method in the step S1 is selected from any one of the followings: oxidizing gas oxidation method, low-temperature oxidation method and chemical reagent oxidation method.

3. The preparation method of claim 1, wherein the step S2 is carried out in a plasma enhanced chemical vapor deposition (PECVD) apparatus.

4. The preparation method of claim 1, wherein a plasma treatment method in the step S2 is a continuous plasma treatment or pulsed plasma treatment.

5. The preparation method of claim 1, wherein the oxygen-containing gas is selected from any one of the followings: $N_2O$, $CO_2$ and $O_2$.

6. A modified tunnel oxide layer prepared by the preparation method of claim 1, wherein the modified tunnel oxide layer has a density of an interface state of lower than $0.5 \times 10^{12}$ $eV^{-1}$ $cm^{-2}$.

7. The modified tunnel oxide layer of claim 6, wherein the modified tunnel oxide layer has a thickness of 1 nm to 4 nm.

8. A TOPCon structure, comprising the modified tunnel oxide layer of claim 6.

9. A solar cell, comprising the TOPCon structure of claim 8.

10. The TOPCon structure of claim 8, wherein the modified tunnel oxide layer has a thickness of 1 nm to 4 nm.

11. A preparation method of a TOPCon structure, comprising: cleaning the semiconductor substrate; preparing the modified tunnel oxide layer by the preparation method of claim 1; preparing a doped amorphous silicon layer; and annealing.

12. The preparation method of claim 11, wherein in the preparation method of the modified tunnel oxide layer, the ion-free bombardment oxidation method in the step S1 is selected from any one of the followings: oxidizing gas oxidation method, low-temperature oxidation method and chemical reagent oxidation method.

13. The preparation method of claim 11, wherein in the preparation method of the modified tunnel oxide layer, the step S2 is carried out in a PECVD apparatus.

14. The preparation method of claim 13, wherein in the preparation method of the modified tunnel oxide layer, a plasma treatment method in the step S2 is a continuous plasma treatment or pulsed plasma treatment.

15. The preparation method of claim 11, wherein in the preparation method of the modified tunnel oxide layer, the oxygen-containing gas is selected from any one of the followings: $N_2O$, $CO_2$ and $O_2$.

16. The preparation method of claim 1, wherein the modified tunnel oxide layer has a thickness of 1 nm to 4 nm.

\* \* \* \* \*